(12) United States Patent
Lee et al.

(10) Patent No.: US 9,706,691 B2
(45) Date of Patent: Jul. 11, 2017

(54) WIRING SHIELDING STRUCTURE

(71) Applicant: SUMITOMO WIRING SYSTEMS, LTD., Yokkaichi, Mie (JP)

(72) Inventors: Hakcheol Lee, Yokkaichi (JP); Noriyuki Sakagami, Yokkaichi (JP); Takamasa Maeda, Yokkaichi (JP)

(73) Assignee: SUMITOMO WIRING SYSTEMS, LTD., Suzuka-shi (JP)

( * ) Notice: Subject to any disclaimer, the term of this patent is extended or adjusted under 35 U.S.C. 154(b) by 0 days.

(21) Appl. No.: 15/035,489

(22) PCT Filed: Nov. 10, 2014

(86) PCT No.: PCT/JP2014/079677
§ 371 (c)(1),
(2) Date: May 10, 2016

(87) PCT Pub. No.: WO2015/079894
PCT Pub. Date: Jun. 4, 2015

(65) Prior Publication Data
US 2016/0295755 A1    Oct. 6, 2016

(30) Foreign Application Priority Data

Nov. 29, 2013    (JP) ................................ 2013-247062

(51) Int. Cl.
*H05K 9/00* (2006.01)
*H02G 3/04* (2006.01)
*B60R 16/02* (2006.01)

(52) U.S. Cl.
CPC ........... *H05K 9/0098* (2013.01); *B60R 16/02* (2013.01); *B60R 16/0207* (2013.01);
(Continued)

(58) Field of Classification Search
CPC .................................................. H05K 9/0098
See application file for complete search history.

(56) References Cited

U.S. PATENT DOCUMENTS

| 2005/0118874 A1* | 6/2005 | Lin ...................... H05K 9/0066 |
| | | 439/620.1 |
| 2009/0167078 A1* | 7/2009 | Watanabe ................ H01B 7/16 |
| | | 307/10.1 |

(Continued)

FOREIGN PATENT DOCUMENTS

| JP | 2006-310474 A | 11/2006 |
| JP | 2006-311699 A | 11/2006 |

(Continued)

OTHER PUBLICATIONS

Jan. 20, 2015 Search Report issued in International Patent Application No. PCT/JP2014/079677.

*Primary Examiner* — Hung V Ngo
(74) *Attorney, Agent, or Firm* — Oliff PLC (57) ABSTRACT

A reduction in the weight of a low-voltage wire is achieved. A high-voltage battery and an inverter are connected to each other by a high-voltage wire, and a low-voltage wire connecting a low-voltage battery and a relay box to each other is routed parallel to the high-voltage wire. Intermediate portions of the high-voltage wire and the low-voltage wire are inserted into a shielding pipe made of metal. The low-voltage wire is inserted into a braided wire for low voltage within the shielding pipe and thus shielded so that propagation of noise from the high-voltage wire to the low-voltage wire within the shielding pipe is prevented. Crimped portions are extended from both end portions of the braided wire for low voltage and fastened to an outer circumferential surface of the shielding pipe together with corresponding braided wires for high voltage by crimping using crimp rings.

1 Claim, 6 Drawing Sheets

(52) U.S. Cl.
CPC ............ *B60R 16/0215* (2013.01); *H02G 3/04* (2013.01); *H02G 3/0481* (2013.01)

(56) References Cited

U.S. PATENT DOCUMENTS

| | | | | |
|---|---|---|---|---|
| 2013/0032393 A1* | 2/2013 | Toyama | ............... | B60R 16/0215 174/72 A |
| 2013/0175079 A1* | 7/2013 | Adachi | ............... | B60R 16/0215 174/350 |
| 2013/0333914 A1* | 12/2013 | Kumada | ............... | H05K 9/0098 174/36 |
| 2014/0216805 A1* | 8/2014 | Adachi | .................. | H01B 7/182 174/350 |
| 2014/0238735 A1* | 8/2014 | Adachi | .................... | H01R 4/20 174/351 |
| 2015/0246647 A1* | 9/2015 | Sugino | ................. | H05K 9/0098 174/102 R |
| 2015/0288105 A1* | 10/2015 | Berman | ............... | H05K 9/0098 174/359 |
| 2016/0052468 A1* | 2/2016 | Kanagawa | ........... | H02G 3/0462 174/68.3 |

FOREIGN PATENT DOCUMENTS

| | | |
|---|---|---|
| JP | 2007-087628 A | 4/2007 |
| JP | 2012-134367 A | 7/2012 |

\* cited by examiner

WIRING SHIELDING STRUCTURE

TECHNICAL FIELD

Preferred embodiments of the present disclosure relate to a wiring shielding structure.

BACKGROUND ART

In electric automobiles and hybrid vehicles, conventionally, a high-voltage battery installed on a rear side of an automobile and an inverter installed in an engine compartment are connected to each other by a plurality of wires (high-voltage power wires). The high-voltage wires are inserted into a shielding pipe in a shielded state, the shielding pipe being routed under the floor of the vehicle. Such a structure is disclosed in below-mentioned Patent Document 1, for example.

CITATION LIST

Patent Document

Patent Document 1: JP 2006-311699A

SUMMARY

Technical Problem

Incidentally, in these days, there is a demand that a low-voltage wire be placed in the shielding pipe alongside the above-described high-voltage wires. For example, a low-voltage wire connecting a battery (12 V battery: low-voltage battery) for auxiliary equipment to a relay box for various low-voltage devices (a lamp, a car audio system, and the like) is expected to be placed in the shielding pipe alongside the high-voltage wires.

However, if a high-voltage wire and a low-voltage wire are placed in a shielding pipe alongside each other as described above, there is a risk of propagation of noise superimposed on the high-voltage wire to the low-voltage wire. In that case, noise may be emitted to the outside from the low-voltage wire that is led out of the shielding pipe, and it is feared that this noise may have an adverse effect on various electric devices installed in the vehicle. As a countermeasure, use of a shielded wire as the low-voltage wire is conceivable.

However, a shielded wire is heavier and has a larger wire diameter than an ordinary wire without shielding functionality. This causes the problem of an increase in the overall weight of the low-voltage wire, and in some cases may also cause the problem of an increase in the diameter of a shielding pipe into which such a large-diameter shielded wire is inserted.

Preferred embodiments were made in view of circumstances such as those described above, and it is an object thereof to provide a wiring shielding structure that can achieve a reduction in the overall weight of a low-voltage wire.

Solution to Problem

A wiring shielding structure according to preferred embodiments is characterized in that the wiring shielding structure includes a high-voltage wire for connecting high-voltage units to each other, a low-voltage wire for connecting low-voltage units to each other, a shielding pipe into which intermediate portions of the high-voltage wire and the low-voltage wire are inserted alongside each other, a shielding member for high voltage into which the high-voltage wire is inserted, the shielding member for high voltage surrounding the high-voltage wire between the shielding pipe and the high-voltage units, and a braided wire for low voltage into which the low-voltage wire is inserted, the braided wire for low voltage surrounding the low-voltage wire inside the shielding pipe.

Advantageous Effects

According to preferred embodiments, since a structure in which the braided wire for low voltage, which is used to shield the low-voltage wire, is arranged within the shielding pipe is adopted, propagation of noise superimposed on the high-voltage wire to the low-voltage wire within the shielding pipe can be avoided. Therefore, with this structure, a situation in which noise is emitted to the outside can be avoided even when the low-voltage wire does not have shielding functionality outside the shielding pipe.

Thus, according to preferred embodiments, unlike conventional configurations, external emission can be avoided without using a shielded wire as the low-voltage wire, but instead using an ordinary wire. Therefore, with respect to the route of the low-voltage wire, a weight reduction can be achieved.

DESCRIPTION OF EMBODIMENTS

The following is a description of preferred embodiments.

(1) In the wiring shielding structure according to preferred embodiments, it is preferable that the shielding member for high voltage is electrically connected to a ground, and a terminal portion of the shielding member for high voltage is fitted over an outer circumferential surface of the shielding pipe and fastened to the outer circumferential surface of the shielding pipe together with the braided wire for low voltage by crimping using a crimp member.

With this configuration, since a portion of the braided wire for low voltage is fastened to the shielding pipe together with the shielding member for high voltage by crimping using the crimp member, the low-voltage wire can be grounded without providing a grounding structure dedicated to the low-voltage wire. Accordingly, a structural portion for grounding can be omitted from the low-voltage wire. Therefore, the number of components can be reduced, and the necessity for the grounding operation can be eliminated.

(2) It is also possible that both of the shielding member for high voltage and the braided wire for low voltage are braided wires woven into a tube shape, the low-voltage wire is led to the outside through a mesh of the shielding member for high voltage, a crimped portion is formed in a terminal portion of the braided wire for low voltage, extended to the outside through the stitch of the shielding member for high voltage, and laid on the terminal portion of the shielding member for high voltage, and the portions that are laid one on top of the other are fastened by crimping using the crimp member.

With this configuration, outside the shielding pipe, the low-voltage wire is led out of the shielding member for high voltage and can be routed freely. Moreover, since a portion of the terminal portion of the braided wire for low voltage is extended as the crimped portion, the braided wire for low voltage can be readily fastened together with the shielding member for high voltage.

Next, Embodiments 1 and 2 of the wiring shielding structure of the preferred embodiments will be described with reference to the drawings.

Embodiment 1

Figure 1:
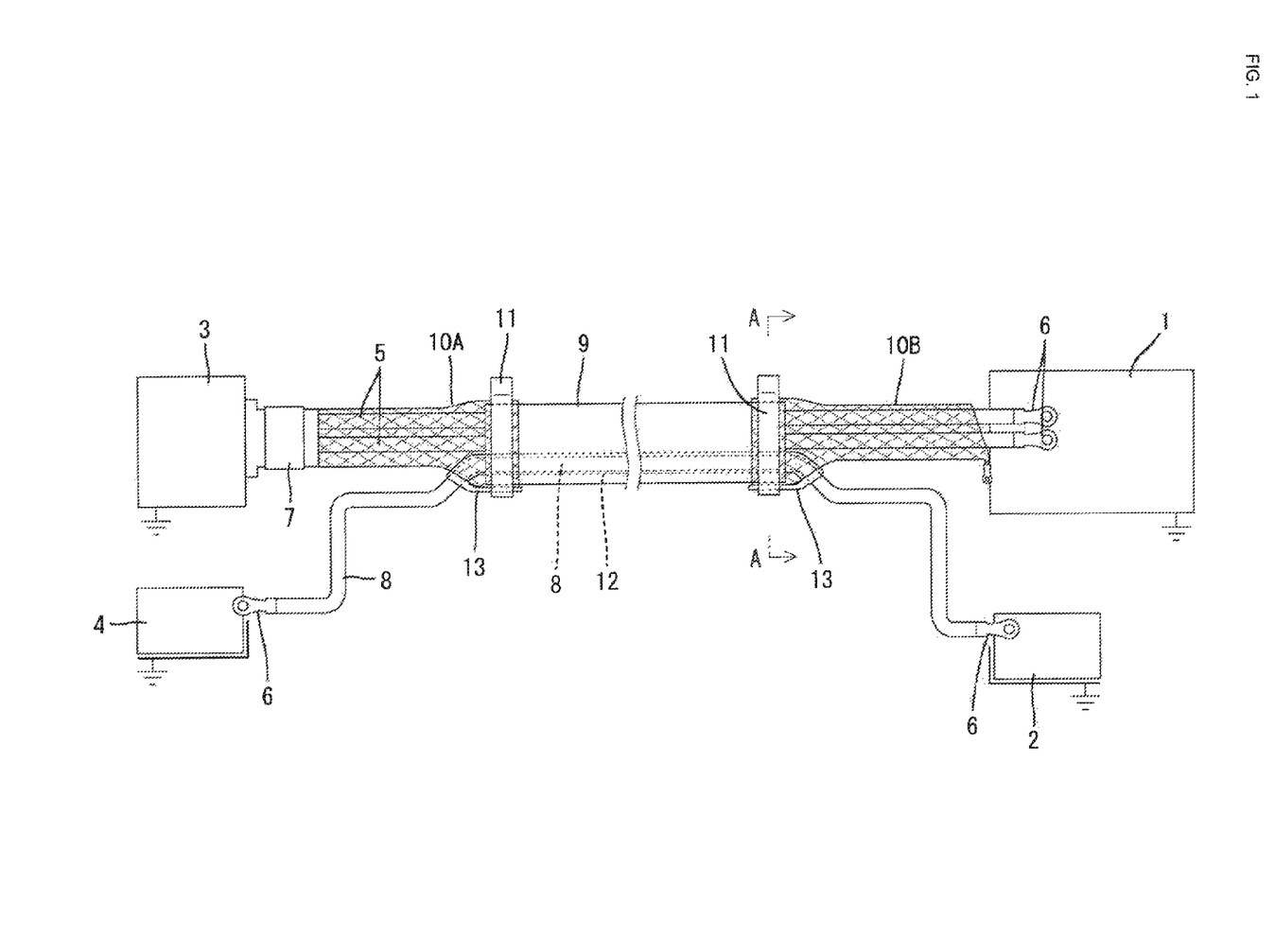
FIG. 1 is an overall view of a wiring shielding structure according to Embodiment 1.
Figure 2:
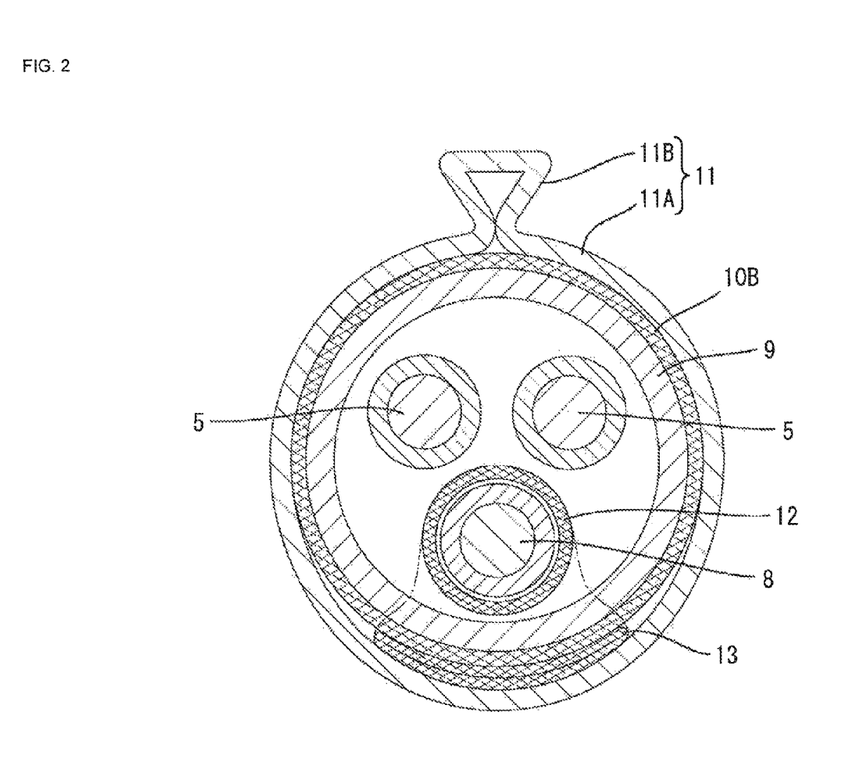
FIG. 2 is a cross-sectional view taken along line A-A in FIG. 1.
Figure 3:
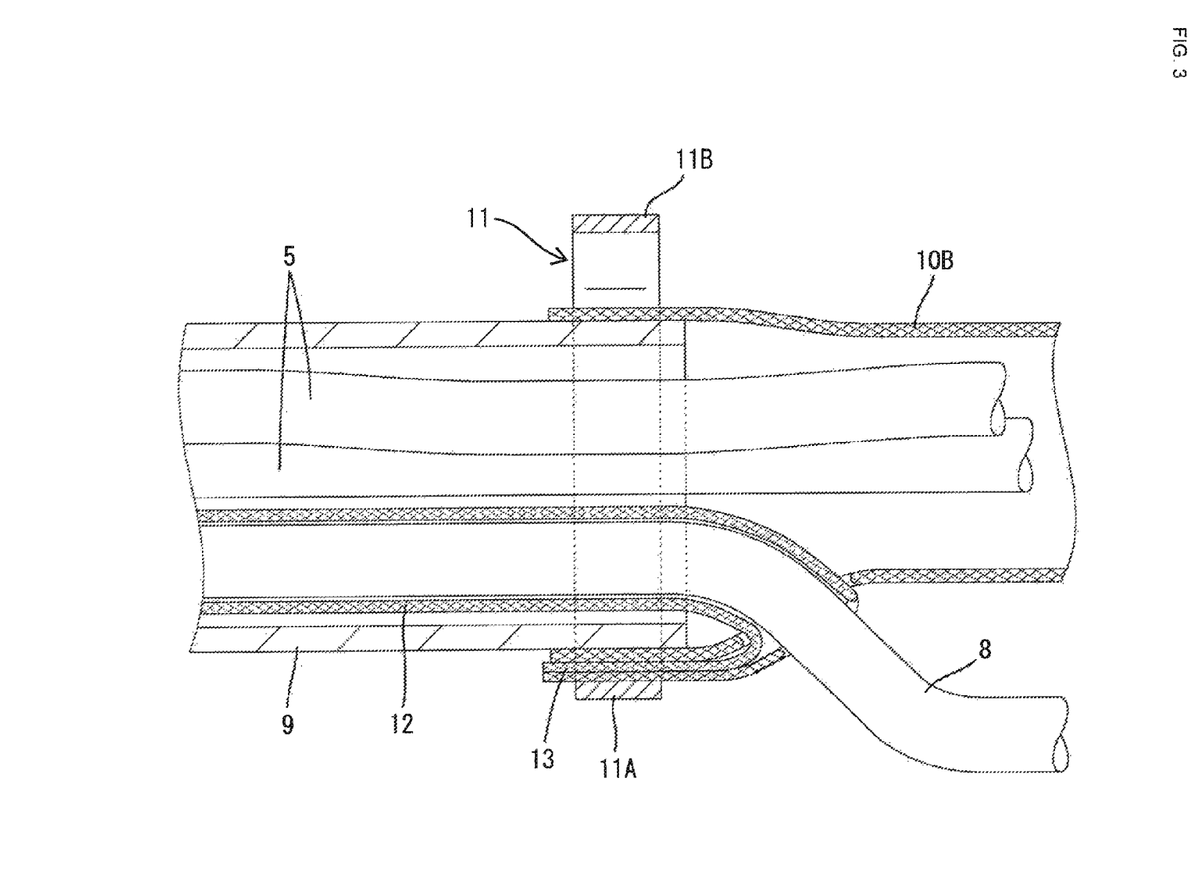
FIG. 3 is an enlarged cross-sectional view of a connection portion where a shielding pipe is connected to a shielding member for high voltage and a shielding member for low voltage.

FIGS. 1 to 3 show Embodiment 1 of preferred embodiments. FIG. 1 schematically shows the overall configuration of a wiring shielding structure applied to an electric automobile or a hybrid vehicle. A high-voltage battery 1 (high-voltage unit) and a low-voltage battery 2 (low-voltage unit) for auxiliary equipment are installed in a rear portion of the vehicle. On the other hand, an inverter 3 (high-voltage unit) connected to a motor, which is not shown, and a relay box 4 (low-voltage unit) connected to various low-voltage devices (a lamp, a car audio system, and the like) are installed in a front portion (e.g., an engine compartment) of the vehicle.

In the drawings, the high-voltage battery 1 and the inverter 3 are connected to each other by two high-voltage wires 5. These high-voltage wires 5 themselves do not have shielding functionality. Ordinary wires constituted by a core wire and coating are used as these wires, and these wires are suitable for high-voltage and large-current applications. Terminal metal fittings 6 are connected to respective end portions of the two high-voltage wires 5 (FIG. 1 shows only those of the terminal metal fittings 6 that are connected to the high-voltage battery 1). Those of the terminal metal fittings 6 that are connected to the high-voltage battery 1 side are individually electrically connected to an output electrode of the high-voltage battery 1. On the other hand, those terminal metal fittings 6 that are connected to the inverter 3 side are incorporated in a component 7, and the electrical connection to the inverter 3 side is established by fitting this component 7 to the inverter 3 side.

The low-voltage battery 2 and the relay box 4 are connected to each other by a low-voltage wire 8. Similarly to the high-voltage wires 5, the low-voltage wire 8 itself does not have shielding functionality, and an ordinary wire constituted by a core wire and coating is used as this wire. Terminal metal fittings 6 are connected to the two end portions of the low-voltage wire 8. The terminal metal fitting 6 on one end side is connected to an electrode of the low-voltage battery 2, and the terminal metal fitting 6 on the other end side is connected to a corresponding terminal (not shown) within the relay box 4. It should be noted that as in the case of the high-voltage wires 5, the number of low-voltage wires 8 shown in the drawings is chosen merely for convenience of illustration, and is not an exact number of low-voltage wires 8.

Intermediate portions of all of the high-voltage wires 5 and the low-voltage wire 8 are inserted into a shielding pipe 9. The shielding pipe 9 of the present embodiment is formed of an elongated pipe made of metal (e.g., made of an aluminum alloy) and having shielding functionality. The shielding pipe 9 is routed under the floor of the vehicle in such a manner as to extend generally along a front-rear direction of the vehicle. The two end portions of the shielding pipe 9 are bent upward and introduced into an inner portion of the vehicle. In order to fix the shielding pipe 9 to a vehicle body side, metal attachment fittings, which are not shown, are arranged at a plurality of locations at intermediate portions of the shielding pipe 9.

Those portions of the high-voltage wires 5 that are led out of the shielding pipe 9 forward and rearward in the front-rear direction of the vehicle are inserted into braided wires 10A and 10B for high voltage (shielding members for high voltage), respectively. The braided wires 10A and 10B for high voltage are each formed by weaving multiple metal wires into a tube shape, and have flexibility. The braided wires 10A and 10B for high voltage are respectively connected to casings (not shown) of or the high-voltage battery 1 by crimping or the like on one end side, and respectively connected to the two end portions of the shielding pipe 9 by crimping using crimp rings 11 (crimp members), which will be described later, on the other end side. Thus, those regions of the high-voltage wires 5 that are located between the shielding pipe 9 and or the high-voltage battery 1 are shielded.

In contrast, within the shielding pipe 9, the low-voltage wire 8 is inserted into a braided wire 12 for low voltage (shielding member for low voltage). The low-voltage wire 8 is inserted into the braided wire 12 for low voltage over substantially the entire length of the shielding pipe 9 (see FIG. 2). Thus, even when noise is superimposed on the high-voltage wires 5, propagation of the noise to the low-voltage wire 8 is avoided.

As shown in FIG. 3, both end portions of the both braided wire 12 for low voltage are led to the outside together with the low-voltage wire 8 through forcibly expanded stitches in those areas of the braided wires 10A and 10B for high voltage that are near the respective shielding pipe 9-side end portions. Furthermore, the low-voltage wire 8 is led to the outside through expanded stitches in those areas of the braided wire 12 for low voltage that are respectively near the two end portions. The two end portions of the braided wire 12 for low voltage are flattened, respectively forming crimped portions 13, which are located outside the corresponding braided wires 10A and 10B for high voltage. As shown in FIGS. 2 and 3, the two crimped portions 13 are each laid on an outer circumferential side of an opening edge of the corresponding braided wire 10A or 10B for high voltage.

The shielding pipe 9-side end portions of the braided wires 10A and 10B for high voltage, together with the corresponding crimped portions 13, are fastened to an outer circumferential surface of the shielding pipe 9 by crimping using the crimp rings 11 (crimp members). The crimp rings 11 are each formed of a metal plate material, and have a known configuration that is constituted by a ring-shaped main body portion 11A for tightening and an operating portion 11B on which a crimping operation is performed. The main body portion 11A has a gap in one portion thereof, that is to say, the ends of the main body portion 11A are separated in a circumferential direction, to form a tightening margin, and the operating portion 11B is formed protruding from this portion outward in a radial direction. Thus, the diameter of the main body portion 11A is reduced by holding base portions of the operating portion 11B and deforming the operating portion 11B such that the base portions are brought close to each other. In this manner, each crimped portion 13 and the corresponding braided wire 10A or 10B for high voltage are simultaneously fastened to the outer circumferential surface of the shielding pipe 9 by crimping.

The effects of Embodiment 1 having the above-described configuration are as follows:

(1) Inside the shielding pipe 9, the low-voltage wire 8 is placed alongside the high-voltage wires 5 at a relatively short distance therefrom. The low-voltage wire 8 itself is an ordinary wire without shielding functionality. However, since the low-voltage wire 8 is inserted into the braided wire 12 for low voltage, even when noise is superimposed on the high-voltage wires 5, propagation of this noise to the low-voltage wire 8 is avoided. Accordingly, no noise is emitted to the outside from the low-voltage wire 8 that is led out of the shielding pipe 9. Thus, according to Embodiment 1, unlike conventional configurations, an ordinary wire can be used, and therefore, the weight of the low-voltage wire 8 can be reduced when compared with conventionally used shielded wires.

(2) The crimped portions 13 are respectively extended from the two end portions of the braided wire 12 for low voltage, and fastened to the shielding pipe 9 together with the corresponding braided wires 10A and 10B for high voltage by crimping using the crimp rings 11. Thus, the ground for the high-voltage wires 5 can double as the ground for the low-voltage wire 8. Therefore, unlike conventional configurations, the necessity for a grounding structure dedicated to the low-voltage wire 8 can be eliminated.

Embodiment 2

Figure 4:
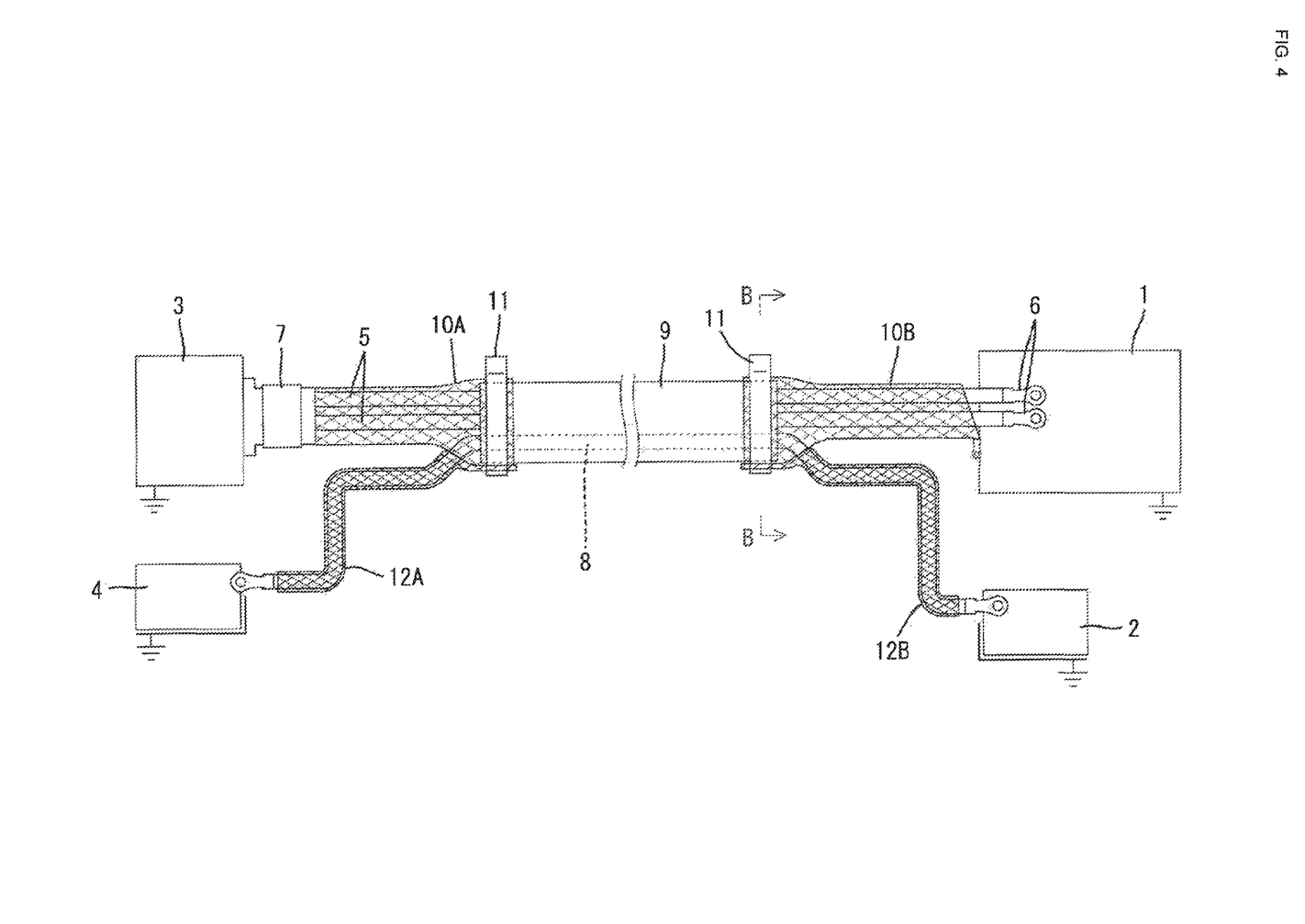
FIG. 4 is an overall view of a wiring shielding structure according to Embodiment 2.
Figure 5:
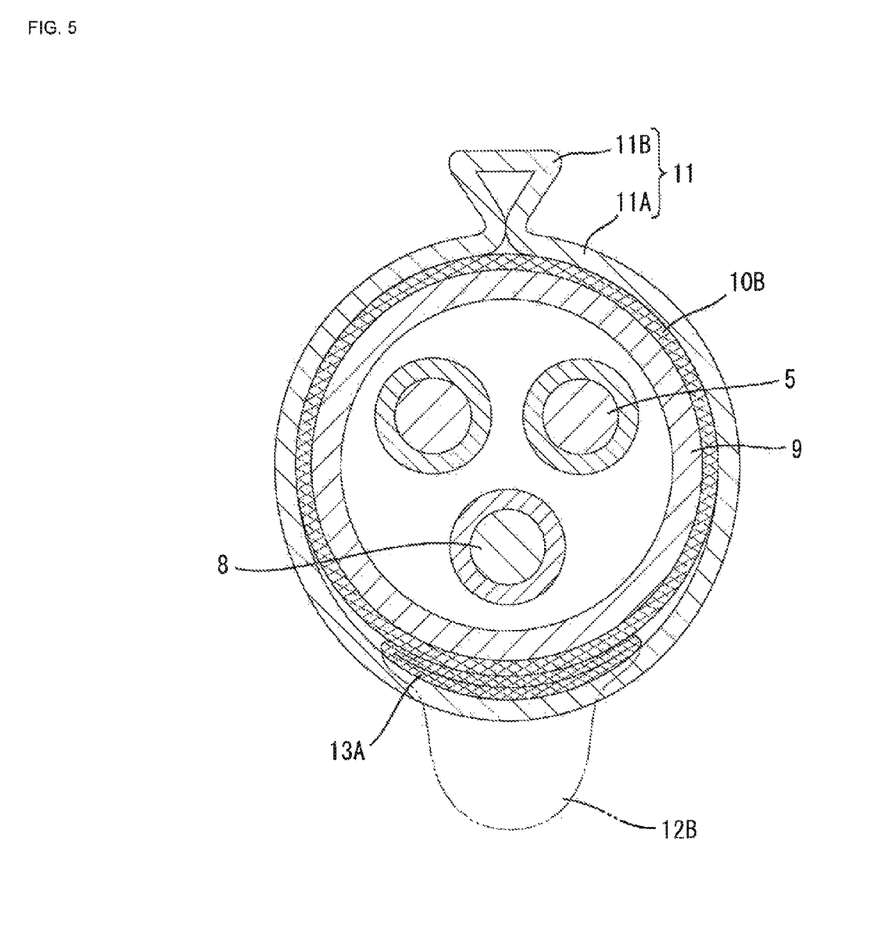
FIG. 5 is a cross-sectional view taken along line B-B in FIG. 4.
Figure 6:
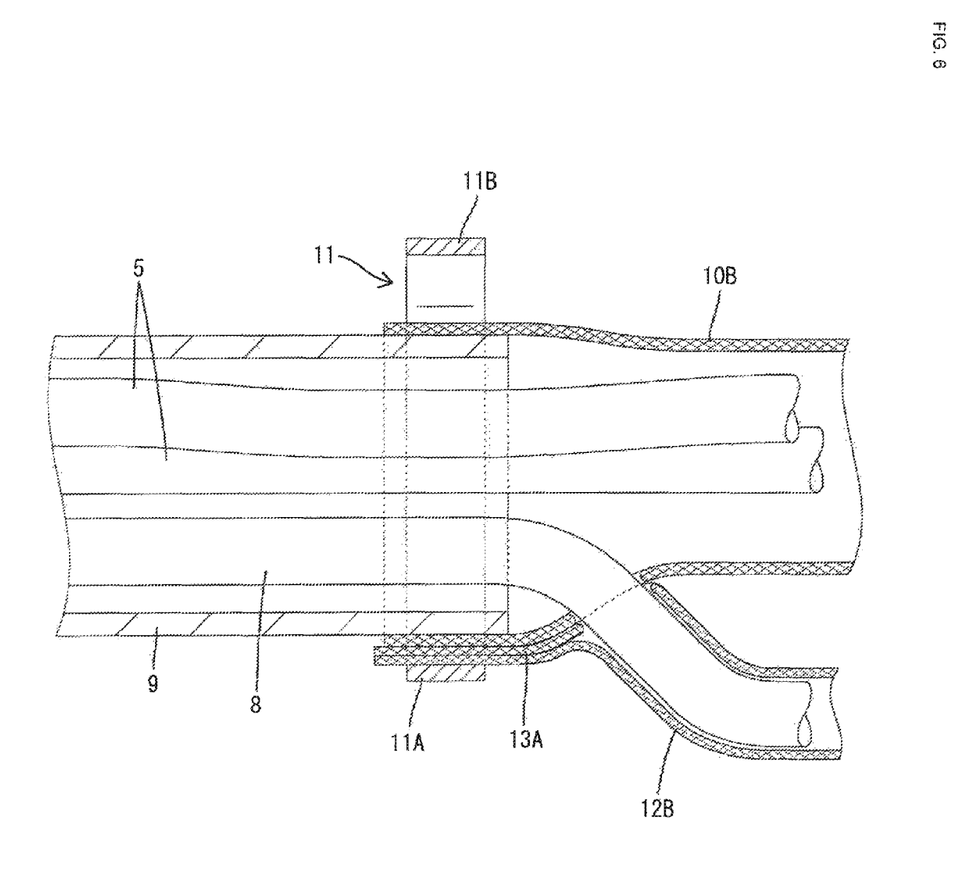
FIG. 6 is an enlarged cross-sectional view of a connection portion where the shielding pipe is connected to the shielding member for high voltage and the shielding member for low voltage.

FIGS. 4 to 6 show Embodiment 2. In Embodiment 1, the low-voltage wire 8 within the shielding pipe 9 is inserted into the braided wire 12A, 12B for low voltage and thus shielded. In contrast, in Embodiment 2, the low-voltage wire 8 is inserted into braided wires 12A and 12B for low voltage outside the shielding pipe 9, and those portions of the low-voltage wire 8 that are located between the shielding pipe 9 and the relay box 4 or the low-voltage battery 2 are respectively shielded. Shielding of the high-voltage wires 5 is the same as that of Embodiment 1, and thus a description thereof is not given.

The low-voltage wire 8 is led out of the two end portions of the shielding pipe 9 and then drawn to the outside through forcibly expanded stitches in those areas of the braided wires 10A and 10B for high voltage that are near the respective shielding pipe 9-side end portions. The drawn-out portions of the low-voltage wire 8 are inserted into the braided wires 12A and 12B for low voltage, respectively. One end side of each of the two braided wires 12A and 12B for low voltage is connected to a casing (not shown) of the relay box 4 or the low-voltage battery 2 by crimping or the like. As shown in FIG. 6, the low-voltage wire 8 is introduced into the inside of the braided wires 12A and 12B for low voltage through stitches on the other end side (shielding pipe 9 side) of the braided wires 12A and 12B for low voltage. The shielding pipe 9-side end portions of the braided wires 12A and 12B for low voltage are flattened, and crimped portions 13A are formed extended therefrom as in the case of Embodiment 1. Each of the two crimped portions 13A is laid on the outer circumference of the shielding pipe 9-side end portion of the corresponding braided wire 10A or 10B for high voltage, and fastened to the outer circumferential surface of the shielding pipe 9 together with the corresponding braided wire 10A or 10B for high voltage by crimping using the crimp ring 11.

According to Embodiment 2 having the above-described configuration, even if noise superimposed on the high-voltage wires 5 propagates to the low-voltage wire 8 within the shielding pipe 9, a situation in which the noise that is thus superimposed on the low-voltage wire 8 is emitted to the outside is avoided because the low-voltage wire 8 outside the shielding pipe 9 is shielded by the braided wires 12A and 12B for low voltage.

Thus, according to Embodiment 2 as well, an ordinary wire that does not have shielding functionality can be used as the low-voltage wire 8 itself, and therefore the overall weight of the low-voltage wire 8 can be reduced. This effect is especially pronounced when the shielding pipe 9 has a long length. Moreover, since the braided wires 12A and 12B for low voltage are fastened to the shielding pipe 9 together with the corresponding braided wires 10A and 10B for high voltage by crimping, the necessity for a grounding structure dedicated to the low-voltage wire 8 can be eliminated by using the same grounding structure for the braided wires 10A and 10B for high voltage and the braided wires 12A and 12B for low voltage as in the case of Embodiment 1. Furthermore, the low-voltage wire 8 inserted into the shielding pipe 9 is not surrounded by the braided wires 12A and 12B for low voltage, and the low-voltage wire 8 itself is an ordinary wire having a smaller diameter than a shielded wire. Thus, an effect of enabling a reduction in the diameter of the shielding pipe 9 is also provided.

Otherwise, Embodiment 2 has the same configuration as Embodiment 1, and therefore can achieve the same effects as Embodiment 1.

Other Embodiments

The present invention is not limited to the embodiments that have been explained by the foregoing description with reference to the drawings. For example, embodiments such as those described below are also embraced within the technical scope of the present invention.

(1) In the foregoing embodiments, the entire shielding pipe 9 is formed of an aluminum alloy. However, the shielding pipe 9 may also have a structure in which a metal foil is concentrically embedded in a resin pipe. That is to say there is no limitation on the material for the shielding pipe as long as the shielding pipe has shielding functionality.

(2) In the foregoing embodiments, both shielding members for high voltage and for low voltage are formed of braided wires. However, for example, corrugated tubes in which metal foils are inserted around the entire circumference and over the entire length may be used instead of braided wires.

(3) In the foregoing embodiments, a braided wire for high voltage and a braided wire for low voltage are connected by crimping. However, the braided wires may be connected by other means such as welding.

(4) In the foregoing embodiments, a braided wire for high voltage and the corresponding crimped portion 13 are fastened by crimping using a crimp ring. However, the fastening may also be performed using a cable tie.

LIST OF REFERENCE NUMERALS

1 High-voltage battery (high-voltage unit)
2 Low-voltage battery (low-voltage unit)

3 Inverter (high-voltage unit)
4 Relay box (low-voltage unit)
5 High-voltage wire
8 Low-voltage wire
9 Shielding pipe
10A, 10B Braided wire for high voltage
11 Crimp ring (crimp member)
12, 12A, 12B Braided wire for low voltage
13, 13A Crimped portion

The invention claimed is:

1. A wiring shielding structure comprising:
a high-voltage wire configured to connect high-voltage units to each other;
a low-voltage wire configured to connect low-voltage units to each other;
a shielding pipe into which intermediate portions of the high-voltage wire and the low-voltage wire are inserted alongside each other;
a tube-shaped braided shielding member for high voltage into which the high-voltage wire is inserted, the shielding member for high voltage surrounding the high-voltage wire between the shielding pipe and the high-voltage units, the shielding member for high voltage configured to be grounded with a terminal portion fitted over an outer circumferential surface of the shielding pipe; and
a tube-shaped braided shielding member for low voltage into which the low-voltage wire is inserted, the shielding member for low voltage surrounding the low-voltage wire inside the shielding pipe, a terminal portion of the shielding member for low voltage having a crimped portion that extends outside the shielding pipe and through expanded stitches of the shielding member for high voltage so as to be laid on top of the terminal portion of the shielding member for high voltage,
wherein the terminal portion of the shielding member for high voltage is crimped and fastened to the shielding pipe, between the terminal portion of the shielding member for low voltage and the shielding pipe, by a crimping member.

* * * * *